United States Patent [19]
Hamasaki et al.

[11] Patent Number: 5,694,065
[45] Date of Patent: Dec. 2, 1997

[54] SWITCHING CONTROL CIRCUITRY FOR LOW NOISE CMOS INVERTER

[75] Inventors: Toshihiko Hamasaki, Yokohama; Yoshiaki Shinohara, Tokyo; Toshio Murota, Kanagawa; Ei-ichi Arihara, Kawasaki, all of Japan

[73] Assignee: Burr-Brown Corporation, Tucson, Ariz.

[21] Appl. No.: 496,501

[22] Filed: Jun. 29, 1995

[30] Foreign Application Priority Data

Aug. 16, 1994 [JP] Japan .................................. 6-192570

[51] Int. Cl.[6] .................................................. H03B 1/00
[52] U.S. Cl. .......................... 327/108; 327/108; 327/379; 326/83
[58] Field of Search ........................... 326/33, 82, 83, 326/86, 94; 327/108, 111, 112, 379, 380, 381

[56] References Cited

U.S. PATENT DOCUMENTS

| | | | |
|---|---|---|---|
| 4,972,100 | 11/1990 | Lim et al. | 326/83 |
| 4,985,646 | 1/1991 | Kumagai et al. | 326/86 |
| 5,017,807 | 5/1991 | Kriz et al. | 326/83 |
| 5,041,741 | 8/1991 | Steele | 326/83 |
| 5,120,999 | 6/1992 | Schreck et al. | 326/83 |
| 5,220,208 | 6/1993 | Schenck | 326/83 |
| 5,367,645 | 11/1994 | Lubeck et al. | 326/83 |
| 5,414,375 | 5/1995 | Tsuboi | 326/83 |
| 5,519,344 | 5/1996 | Proebsting | 326/82 |

Primary Examiner—Timothy P. Callahan
Assistant Examiner—Jeffrey Zweizig
Attorney, Agent, or Firm—Cahill, Sutton & Thomas P.L.C.

[57] ABSTRACT

An inverter device is provided which comprises an inverter including a pair of transistors, and first and second delay circuits. The first and second delay circuits are connected to respective inputs of the pair of transistors so as to cause the transistors of the pair to switch with a greater time difference, thereby reducing noise due to switching operations in the inverter.

10 Claims, 8 Drawing Sheets

SWITCHING CONTROL CIRCUITRY FOR LOW NOISE CMOS INVERTER

BACKGROUND OF THE INVENTION:

1. Field of the Invention

The present invention relates to a low-noise inverter device suitable for use in an integrated-circuit.

2. Description of the Prior Art

Known integrated-circuits include, in addition to inverters of the sort used in typical logic circuits, large-current inverters which generate an output current as large as more than a hundred micro-amperes. When large-current inverters are used in integrated-circuits which incorporate low-noise required in precision analog circuits, the switching operations of the large-current inverters can introduce noise in the silicon substrates, power supply conductors and/or ground conductors. The suppression of such noise is an important factor which influences the analog performances of the integrated-circuits.

Various attempts have been made to solve the problem of such noise suppression. For example, layouts of integrated-circuits have been so engineered that any large-current inverters are disposed to be as remote as possible from analog circuits. Further, wide conductors have often been used for power supply lines or ground lines.

It is also known to use a pair of additional inverters connected to the inputs of a large-current or main inverter to provide a time difference between the switchings of a p-type metal-oxide-semiconductor (PMOS) transistor and an n-type metal-oxide-semiconductor (NMOS) transistor comprising the main inverter, thereby avoiding simultaneous ON-states (i.e., conductive states) of the transistors. Nevertheless, even with this arrangement, large-current inverters may still generate too much noise to be acceptable for use with certain kinds of precision analog circuits such as high accuracy digital-analog converters.

SUMMARY OF THE INVENTION

An object of the invention, therefore, is to provide an inverter device which further reduces the noise from levels achieved by the closest prior art.

Another object of the invention is to provide a low-noise inverter device which is suitable for use with precision analog circuits.

In order to achieve the above objects, according to the present invention, there is provided an inverter device comprising: a) an input terminal for receiving an input signal and an output terminal for generating an output signal; b) a first inverter circuit including a first transistor of a first conductivity type and a second transistor of a second conductivity type different from the first conductivity type, said first transistor having a first current carrying electrode connected to a first supply voltage conductor, a second current carrying electrode connected to said output terminal and a control electrode, said second transistor having a first current carrying electrode connected to a second supply voltage conductor, a second current carrying electrode connected to said output terminal and a control electrode; c) a first variable delay means connected between said input terminal and said control electrode of said first transistor for generating a first delayed output signal with a variable delay, said first variable delay means including a first capacitor, said first variable delay means being operative to cause said first delay output signal to have a first delay when said input signal changes in a first direction making said first and second transistors conductive and non-conductive, respectively, and a second delay shorter than said first delay when said input signal changes in a second direction making said first and second transistors non-conductive and conductive, respectively; and d) a second variable delay means connected between said input terminal and said control electrode of said second transistor for generating a second delayed output signal with a variable delay, said second variable delay means including a second capacitor, said second variable delay means being operative to cause said second delayed output signal to have a third delay shorter than said first delay when said input signal changes in said first direction and a fourth delay longer than said second delay when said input signal changes in said second direction.

With the above arrangement, said first and second capacitors serve to enlarge the difference in length between said first and second delays, as well as the difference in length between said third and fourth delays.

Further, according to the present invention, said first variable delay means may comprise: a) at least one stage of second inverter circuit connected between said first supply voltage conductor and said second supply voltage conductor; and b) a first low-pass filter including said first capacitor and having an input connected for receiving an output of said second inverter circuit and an output connected to said control electrode of said first transistor; and said second variable delay means may comprise a) at least one stage of third inverter circuit connected between said first supply voltage conductor and said second supply voltage conductor; and b) a second low-pass filter including said second capacitor and having an input connected for receiving an output of said third inverter circuit and an output connected to said control electrode of said second transistor.

Further, according to the present invention, each of said second and third inverter circuits may comprise a single stage of inverter circuit. Then, said second inverter circuit may comprise: a) a third transistor of the first conductivity type having a first current carrying electrode connected to said first supply voltage conductor, a second current carrying electrode connected to a first common node and a control electrode connected to said input terminal; and b) a fourth transistor of the second conductivity type having a first current carrying electrode connected to said second supply voltage conductor, a second current carrying electrode connected to said first common node and a control electrode connected to said input terminal; and said third inverter circuit may comprise: a) a fifth transistor of the first conductivity type having a first current carrying electrode connected to said first supply voltage conductor, a second current carrying electrode connected to a second common node and a control electrode connected to said input terminal; and b) a sixth transistor of the second conductivity type having a first current carrying electrode connected to said second supply voltage conductor, a second current carrying electrode connected to said second common node and a control electrode connected to said input terminal.

Further, according to the present invention, each of said transistors of the first conductivity type may be a p-type metal-oxide-semiconductor (MOS) transistor; and each of said transistors of the second conductivity type may be an n-type MOS transistor. Then, said third transistor may have a channel width greater than that of said fourth transistor; and said fifth transistor may have a channel width smaller than that of said sixth transistor.

Further, according to the present invention, said first low-pass filter may comprise: a) a first resistor connected between said first common node and said control electrode of said first transistor; and b) said first capacitor connected at its one end to said control electrode of said first transistor and at the other end to one or both of said first and second supply voltage conductors; and said second low-pass filter may comprise: a) a second resistor connected between said second common node and said control electrode of said second transistor; and b) said second capacitor connected at its one end to said control electrode of said second transistor and at the other end to one or both of said first and second supply voltage conductors.

BRIEF DESCRIPTION OF THE DRAWINGS

The present invention will hereinafter be explained in connection with the preferred embodiment with reference to the accompanying drawings.

DETAILED DESCRIPTION OF THE PREFERRED EMBODIMENT

Figure 1:
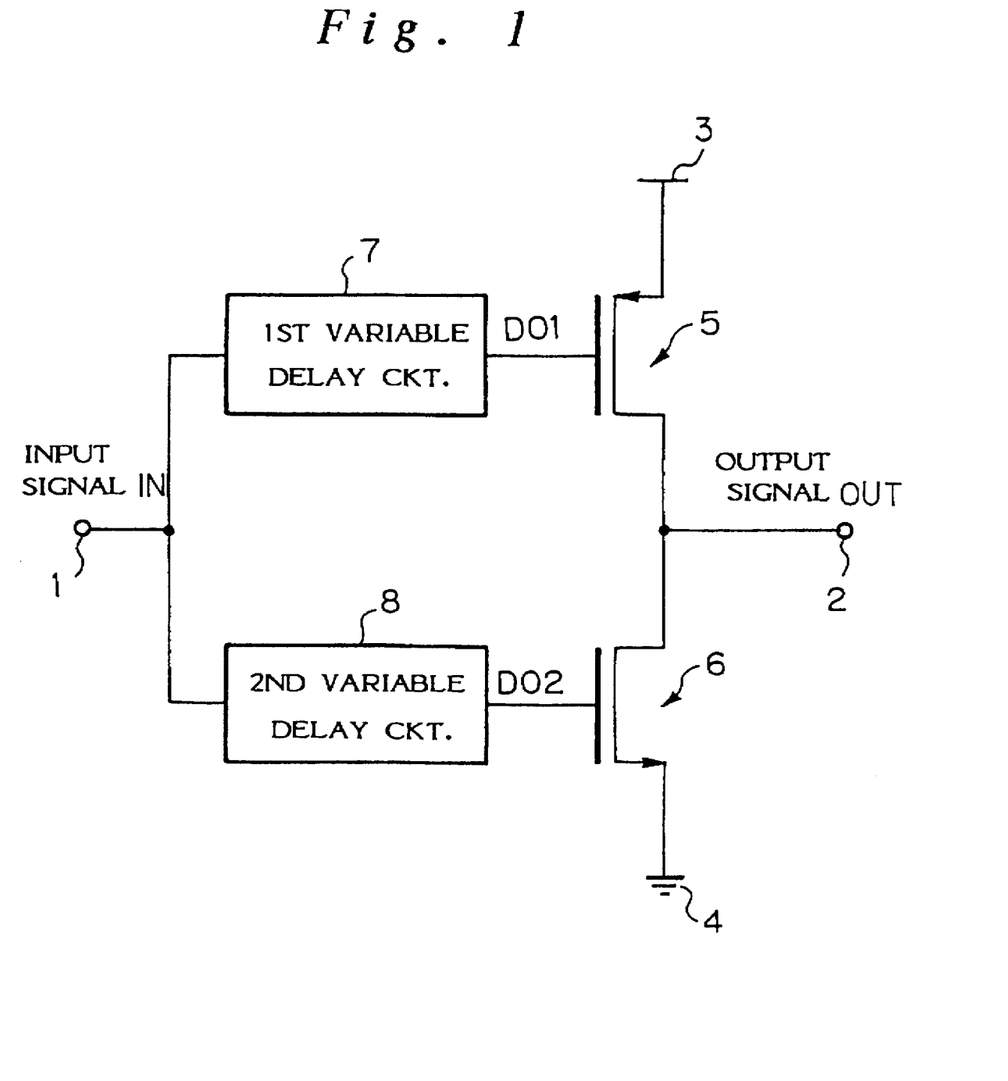
FIG. 1 is a block and schematic diagram of an inverter device according to the present invention which has a basic arrangement.

FIG. 1 illustrates an inverter device according to the present invention which has the basic arrangement. As shown, the inverter device has an input terminal 1 to which an input signal IN is applied and an output terminal 2 which generates an output signal OUT which is the inversion of the input signal. The inverter device further includes a main inverter circuit which comprises a p-type metal-oxide-semiconductor (PMOS) transistor 5 and an n-type metal-oxide-semiconductor (NMOS) transistor 6 connected in series between a supply voltage conductor 3 and a ground voltage conductor 4. The transistors 5 and 6 have their drains connected with each other and to the output terminal 2. The transistors 5 and 6 have their gates connected through a first variable delay circuit 7 and a second variable delay circuit 8, respectively, to the input terminal 1.

The first variable delay circuit 7 generates a delayed output signal D01. The delayed output signal D01 has a first delay $t_{1D1}$ when the input signal IN changes in a first direction or direction of level increase making the PMOS transistor 5 turn on and the NMOS transistor 6 turn off, and a second delay $t_{1D2}$ when the input signal IN changes in a second direction or direction of level decrease making the transistor 5 turn off and the transistor 6 turn on. The second delay $t_{1D2}$ is shorter than the first delay $t_{1D1}$. Similarly, the second variable delay circuit 8 generates a delayed output signal D02. The delayed output signal D02 has a first delay $t_{2D1}$ (which is shorter than the first delay $t_{1D1}$ of the first delay circuit 7) when the input signal IN changes in the first direction, and a second delay $t_{2D2}$ (which is longer than the second delay $t_{1D2}$ of the first delay circuit 7) when the input signal IN changes in the second direction.

Figure 2:
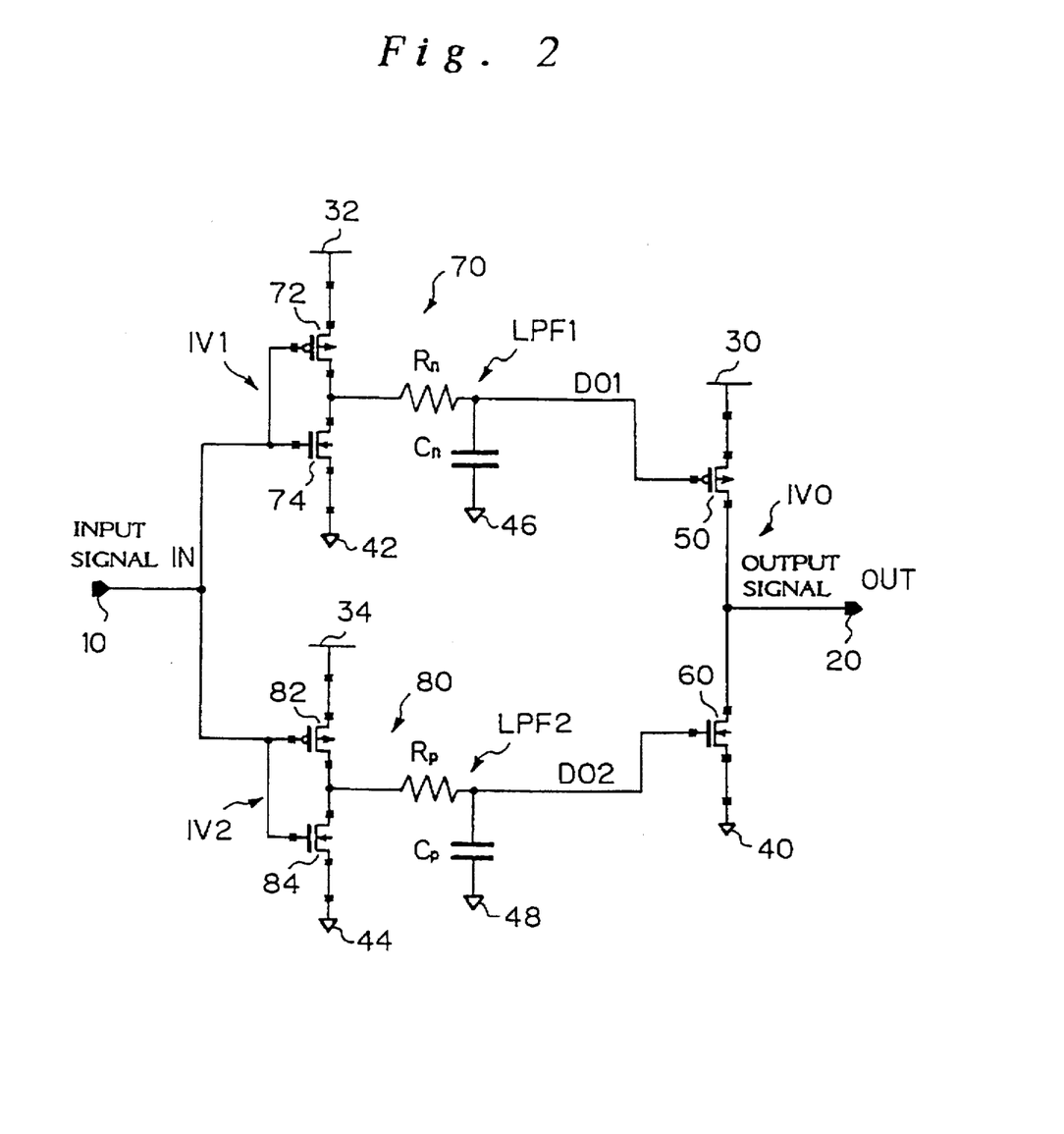
FIG. 2 is a schematic diagram of a more specific embodiment of the inverter device having the basic arrangement shown in FIG. 1.

Referring now to FIG. 2, a more specific embodiment of the inverter device having the basic arrangement shown in FIG. 1 will be described. The inverter device of this embodiment includes an input terminal 10, an output terminal 20, a main inverter circuit IV0 comprising a PMOS transistor 50 and an NMOS transistor 60, a first variable delay circuit 70 and a second variable delay circuit 80, all of which corresponds to the components with the same names shown in FIG. 1. The transistor 50 is connected to a supply voltage conductor at a node 30, and the transistor 60 is connected to a ground conductor at a node 40. In this embodiment, each of the variable delay circuits 70 and 80 comprises an inverter circuit and a low-pass filter. Specifically, the variable delay circuit 70 includes an inverter circuit IV1 which comprises a PMOS transistor 72 and an NMOS transistor 74 having their drains connected with each other. The delay circuit 70 also includes a low-pass filter LPF1 which comprises a resistor Rn and a capacitor Cn, the former being connected between the drain of the transistor 72 and the gate of the transistor 50 and the latter being connected between the gate of the transistor 50 and a node 46 for connection to the ground conductor. The transistor 72 has a source connected to the supply voltage conductor at a node 32, and the transistor 74 has a source connected to the ground conductor at a node 42. Similarly, the variable delay circuit 80 includes an inverter circuit IV2 which comprises a PMOS transistor 82 and an NMOS transistor 84 having their drains connected with each other. The delay circuit 80 further includes a low-pass filter LPF2 which comprises a resistor Rp and a capacitor Cp, the former being connected between the drain of the transistor 82 and the gate of the transistor 60 and the latter being connected between the gate of the transistor 60 and a node 48 for connection to the ground conductor. The transistor 82 has a source connected to the supply voltage conductor at a node 34, and the transistor 84 has a source connected to the ground conductor at a node 44. As previously described, to improve noise suppression, the node 30 for connection to the supply voltage conductor is preferably as remote as possible from other nodes 32 and 34, and the node 40 for connection to the ground conductor is preferably as remote as possible from other nodes 42, 44, 46 and 48.

Exemplified values for the channel width (W)/length (L) of each of the MOS transistors used in the inverter device in FIG. 2 are as follows:

TABLE

| Transistor | Channel width (μm)/length (μm) |
| --- | --- |
| PMOS transistor 50 | 156/1.2 |
| NMOS transistor 60 | 97/1.2 |
| PMOS transistor 72 | 27/1.2 |
| NMOS transistor 74 | 4.2/1.2 |
| PMOS transistor 82 | 7/1.2 |
| NMOS transistor 84 | 13/1.2 |

As is well known in the art, the channel width of a MOS transistor influences its turn-on and turn-off threshold voltages, on resistance and driving power or current supply capacity. The smaller channel width results in the higher on resistance, and the latter typically ranges from hundreds of ohms to tens of thousands of ohms. In the embodiment of FIG. 2, the transistor 72 has an on resistance smaller than that of the transistor 74, and the transistor 82 has an on resistance greater than that of the transistor 84.

In the above arrangement of the embodiment, the inverter circuit IV1 operates such that: it switches at the threshold voltage of 4.3 volts when the input signal IN rises up from 0 volts to 5 volts; and it switches at the threshold voltage of 1.3 volts when the input signal IN falls down from 5 volts to 0 volts. The other inverter circuit IV2 operates such that: when the input signal IN rises up, it switches at the threshold voltage of 3.4 volts, which is lower (or earlier) than that of the inverter circuit IV1; and when the input signal IN falls down, it switches at the threshold voltage of 0.7 volts, which is lower (or later) than that of the inverter circuit IV1.

Figure 3:
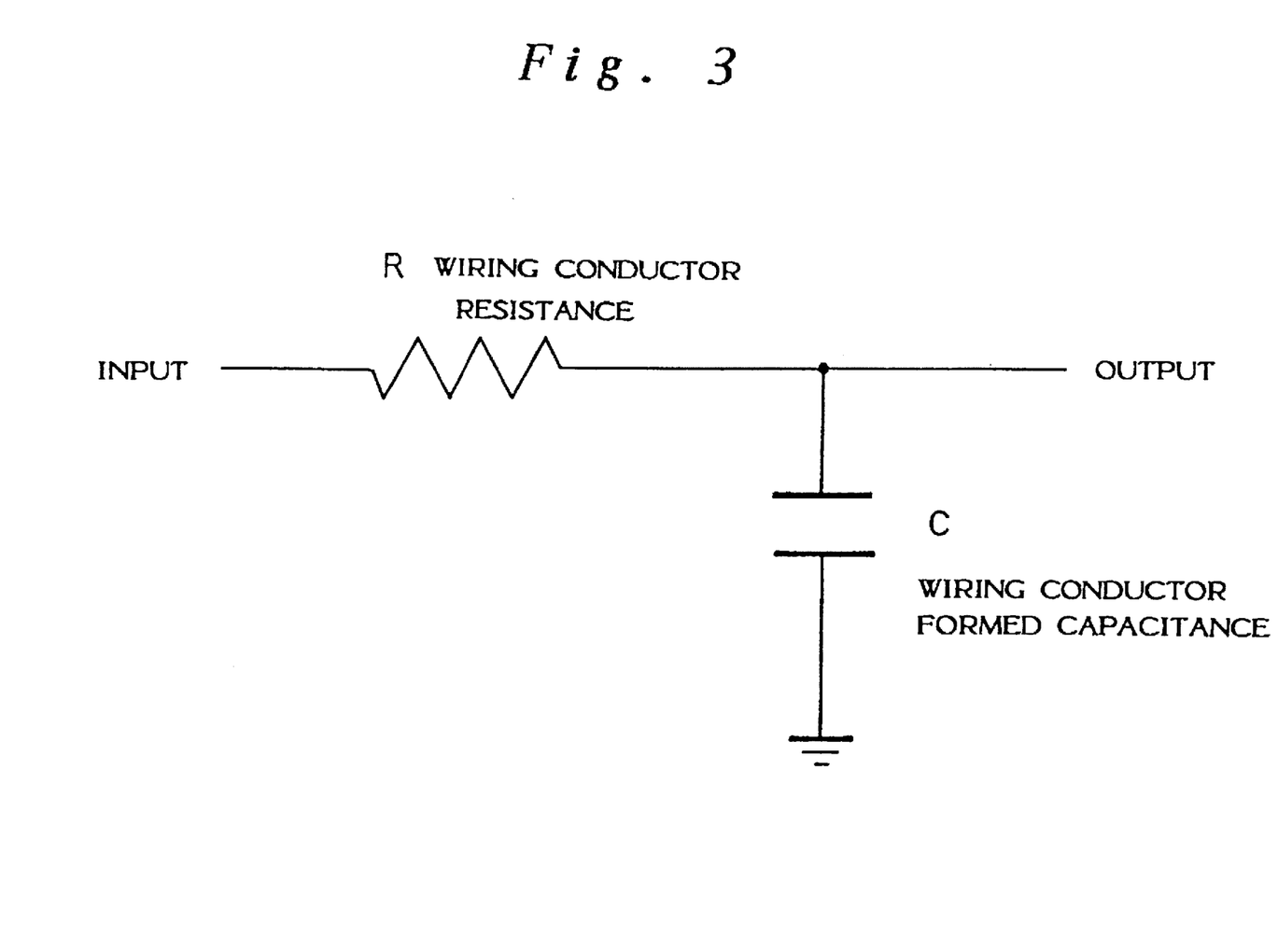
FIG. 3 is a schematic diagram of the circuit elements of a low-pass filter shown in FIG. 2 when it is implemented on an integrated-circuit.

When the inverter device shown in FIG. 2 is implemented on an integrated-circuit, each of the low-pass filters may be formed by a wiring conductor resistance R and a wiring conductor formed capacitance C as seen in an equivalent circuit shown in FIG. 3. However, since the wiring conductor resistance R may be about 0.5 ohms and much smaller than the on resistances of the transistors, the effective resistances of the low-pass filters are actually dominated by the on resistances of the transistors 72 or 74 and 82 or 84, respectively. In contrast, the wiring conductor formed capacitance or capacitor element C may be about 0.5 pF which is much greater than any stray capacitance.

Figure 4:
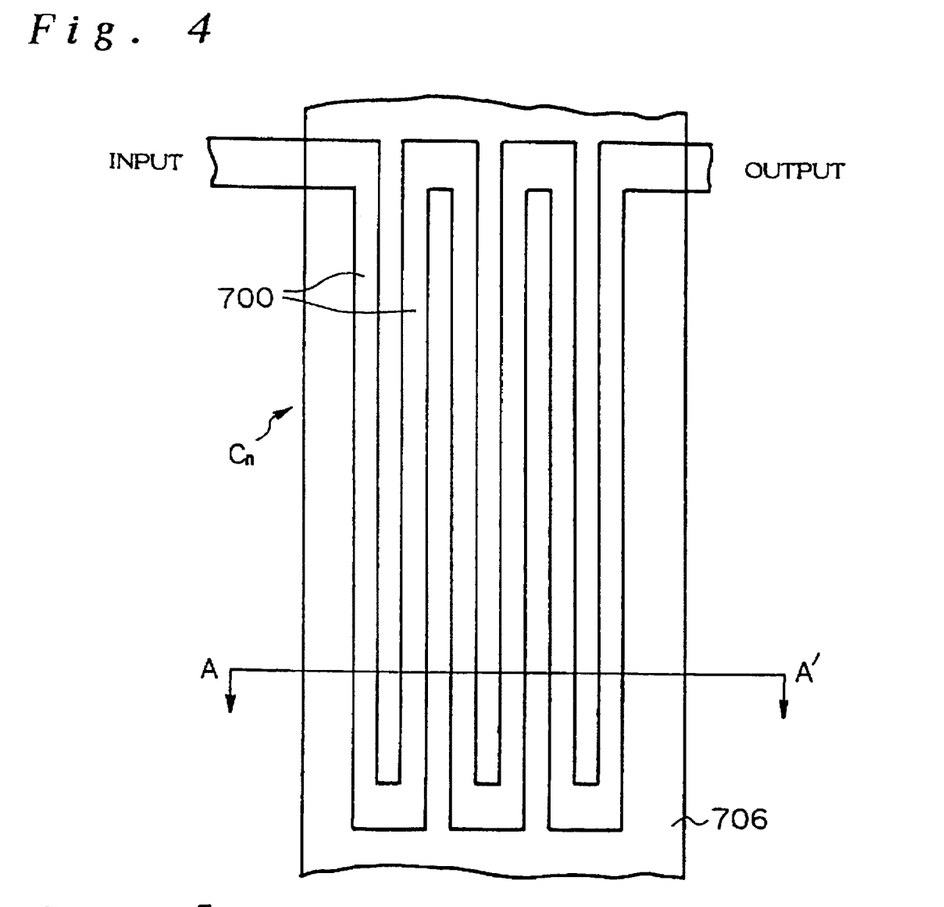
FIG. 4 is a plan view of the structure of a capacitor or wiring-conductor formed capacitance shown in FIG. 3 implemented on the integrated-circuit.
Figure 5:
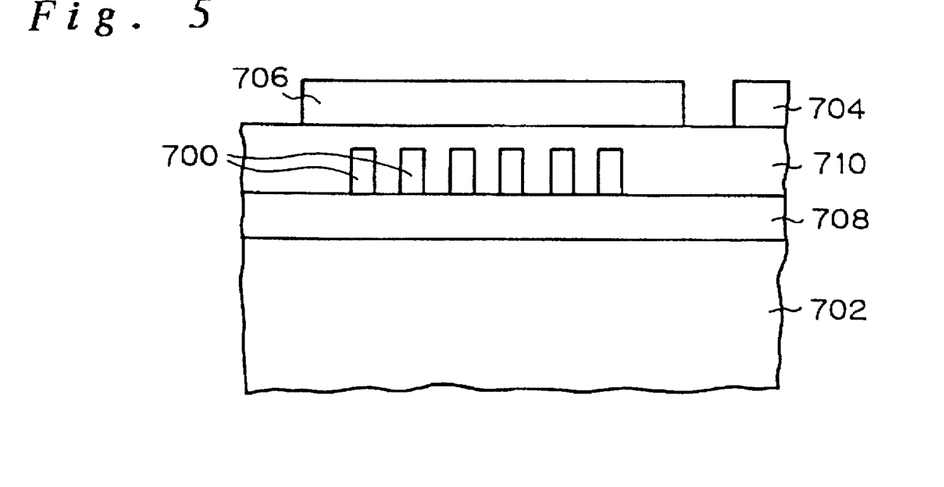
FIG. 5 is a sectional view taken along line A–A' in FIG. 4.

FIGS. 4 and 5 show the structure of a capacitor element Cn in plan view and in sectional side view, respectively. As shown, the capacitor element Cn includes a metal conductor 700 which is formed in a serpentine shape and has one end connected to the output of the inverter circuit IV1 comprising CMOS transistors 72 and 74. The capacitor element Cn may include a silicon substrate 702 of the integrated-circuit maintained at the supply voltage, a power supply metal conductor 704 not shown in FIG. 4 (which is connected with the substrate 702 by means of through holes), and/or a ground metal conductor 706, all of which may be formed around the metal conductor 700. Further, insulator layers 708 and 710 may be provided between the metal conductor 700 and the other portions 702, 704 and/or 706 to form the capacitor element Cn. A capacitor element Cp for the other inverter circuit IV2 may be formed in the same manner.

Figure 6:
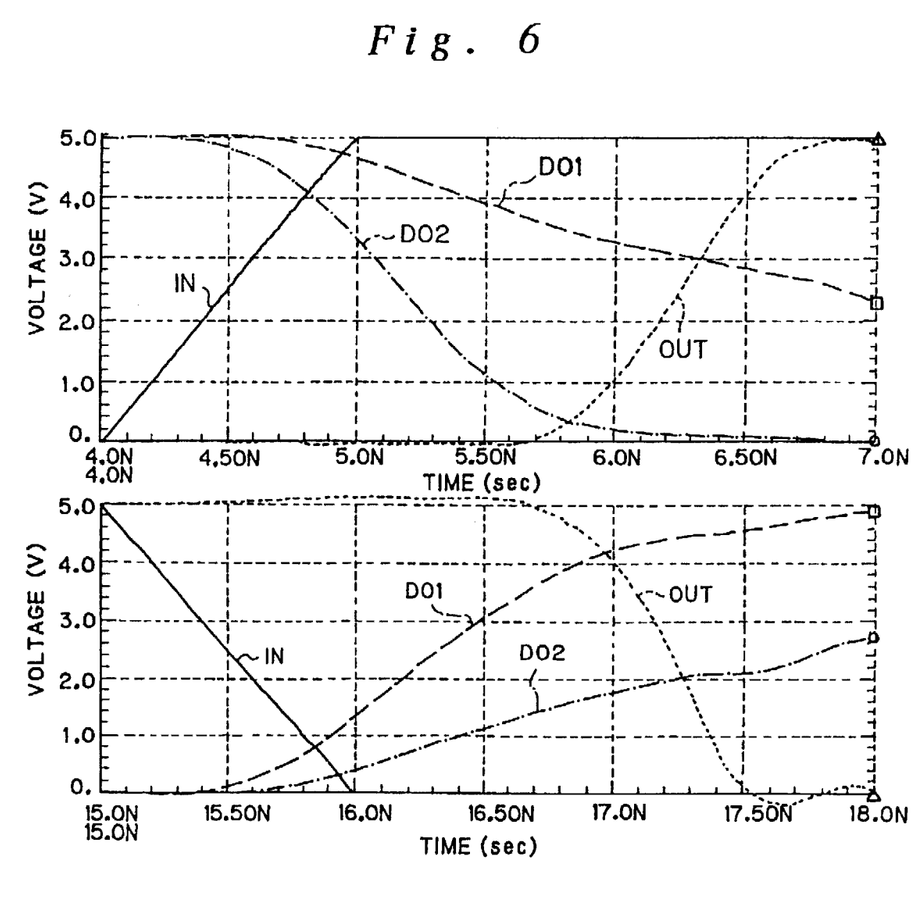
FIG. 6 is a waveform diagram obtained by a simulation which shows the characteristics of the inverter device of FIG. 2 by illustrating the waveforms of delayed outputs D01 and D02 and an inverter output OUT, as generated when an input signal IN rises up from 0 volts to 5 volts and falls down again to 0 volts.

Referring now to FIGS. 6 to 9, the operation of the inverter device shown in FIG. 2 will be described. FIG. 6 shows the waveforms of the delayed outputs D01 and D02 and the inverter output OUT, as generated when the input signal IN rises up from 0 volts to 5 volts and then falls down again to 0 volts. As seen from the figure, when the input IN rises up from 0 volts to 5 volts, the delayed output D02 decreases more rapidly than the delayed output D01 (due to the fact that the transistor 84 has a channel width greater than, and therefore an on resistance smaller than those of the transistor 74 so that the capacitor Cp is discharged faster than the capacitor Cn), as the result of which the delayed output D02 causes the transistor 60 to turn off first, and thereafter the delayed output D01 causes the transistor 50 to turn on, thereby making the inverter output OUT start increasing. In this process, the delay time $t_{2D1}$ of the delayed output D02 is about 0.75 ns (nano-seconds) and the delay time $t_{1D1}$ of the delayed output D01 is about 2.25 ns. In contrast, when the input IN falls down from 5 volts to 0 volts, D01 increases more rapidly than D02 (due to the fact that the transistor 72 has a channel width greater than, and therefore an on resistance smaller than those of the transistor 82 so that the capacitor Cn is charged faster than the capacitor Cp), as the result of which D01 causes the transistor 50 to turn off first, and thereafter D02 causes the transistor 60 to turn on, thereby making the inverter output OUT start decreasing. In this process, the delay time $t_{1D2}$ of the delayed output D01 is about 0.75 ns and the delay time $t_{2D2}$ of the delayed output D02 is about 2.25 ns.

Figure 7A:
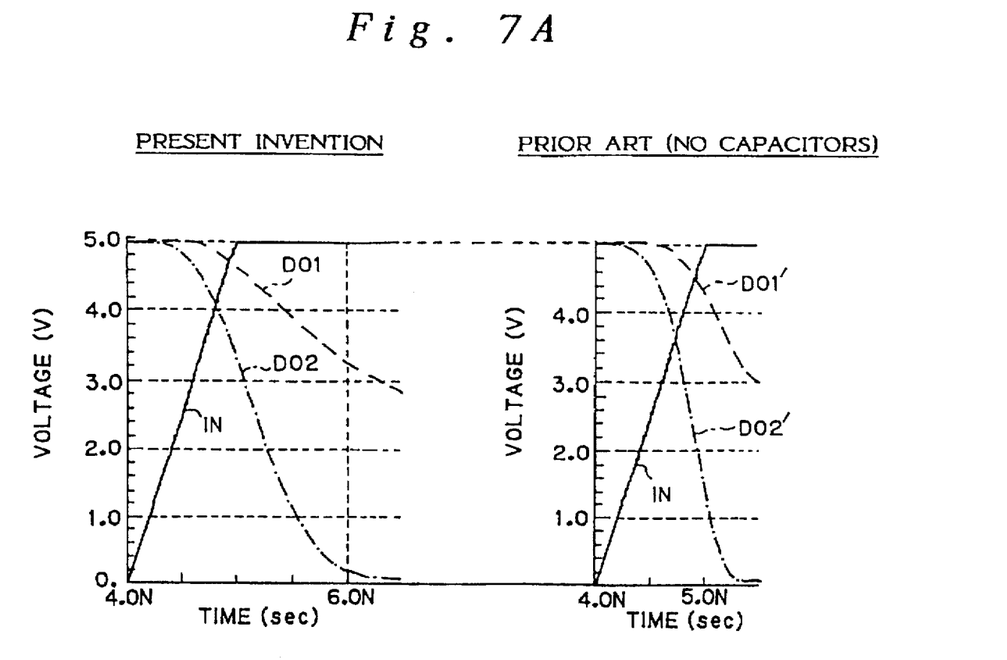
FIGS. 7A and 7B show waveform diagrams obtained by a simulation which show the characteristics of two inverter devices, i.e., the inverter device including capacitors Cn and Cp according to the present invention and a prior art inverter device having no such capacitors.
Figure 7B:
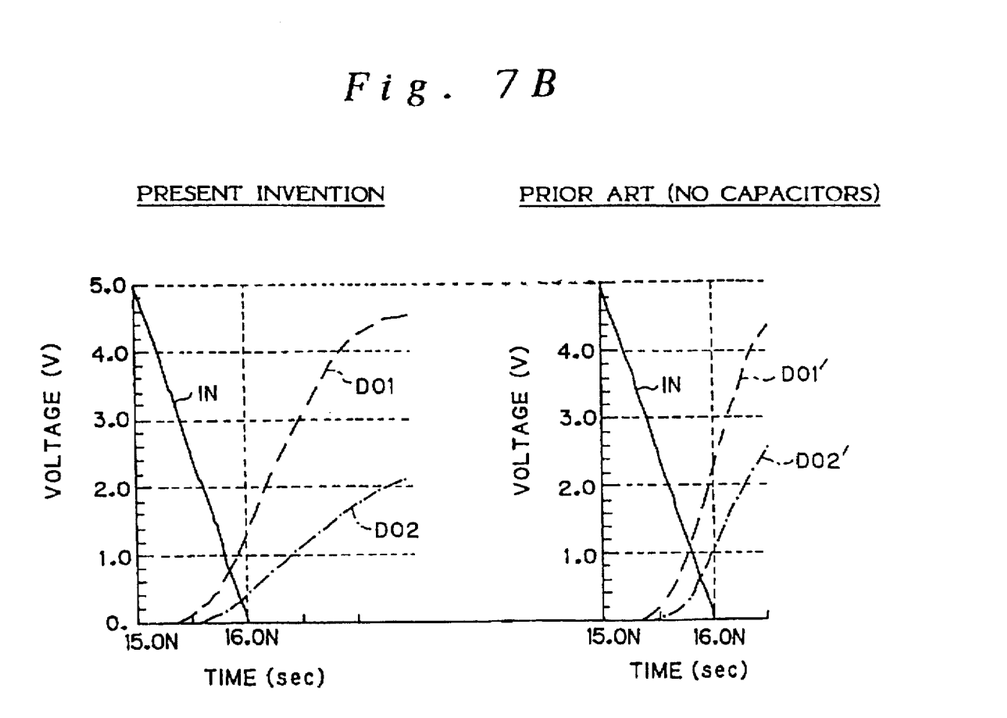

Referring next to FIG. 7, the characteristics of two inverter devices will be compared, one being the inverter device according to the present invention having the capacitors Cn and Cp, and the other being a prior art inverter device having no such capacitor (i.e., an inverter device having the arrangement of FIG. 2 but the capacitors Cn and Cp are removed). In the prior art inverter device, because of the difference between the threshold voltages of the inverter circuits IV1 and IV2, there is some difference between the initial delays of the delayed outputs D01' and D02' as well as some difference between the slopes of the outputs D01' and D02' upon both the rising and falling of the delayed outputs D01' and D02'. In the inverter device according to the present invention, by virtue of the effect of the low-pass filters in addition to the effect of the difference between the threshold voltages of the inverter circuits IV1 and IV2, there is a greater difference between the slopes of the delayed outputs D01 and D02 upon both the rising and falling thereof. As the result, although the initial delay difference between the delayed outputs of the present invention's device is comparable with that of the prior art device, the delay difference between the effective portions of the delayed outputs D01 and D02 is greater than that of the prior art device. For example, FIG. 7A shows that when the both delayed outputs fall down from 5 volts, crossing the above mentioned threshold voltages and down to 3 volts, the delay difference is about 0.7 ns in the prior art device, while about 1.25 ns in the present invention's device. FIG. 7B shows that when the delayed outputs rise up from 0 volts, crossing the above mentioned threshold voltages and up to 2 volts, the delay difference is about 0.35 ns in-the prior art device, while about 1.1 ns in the present invention's device. This results in a greater time difference between the turn on and turn off times of the transistors 50 and 60 of the main inverter circuit IV0 as described above.

Figure 8:
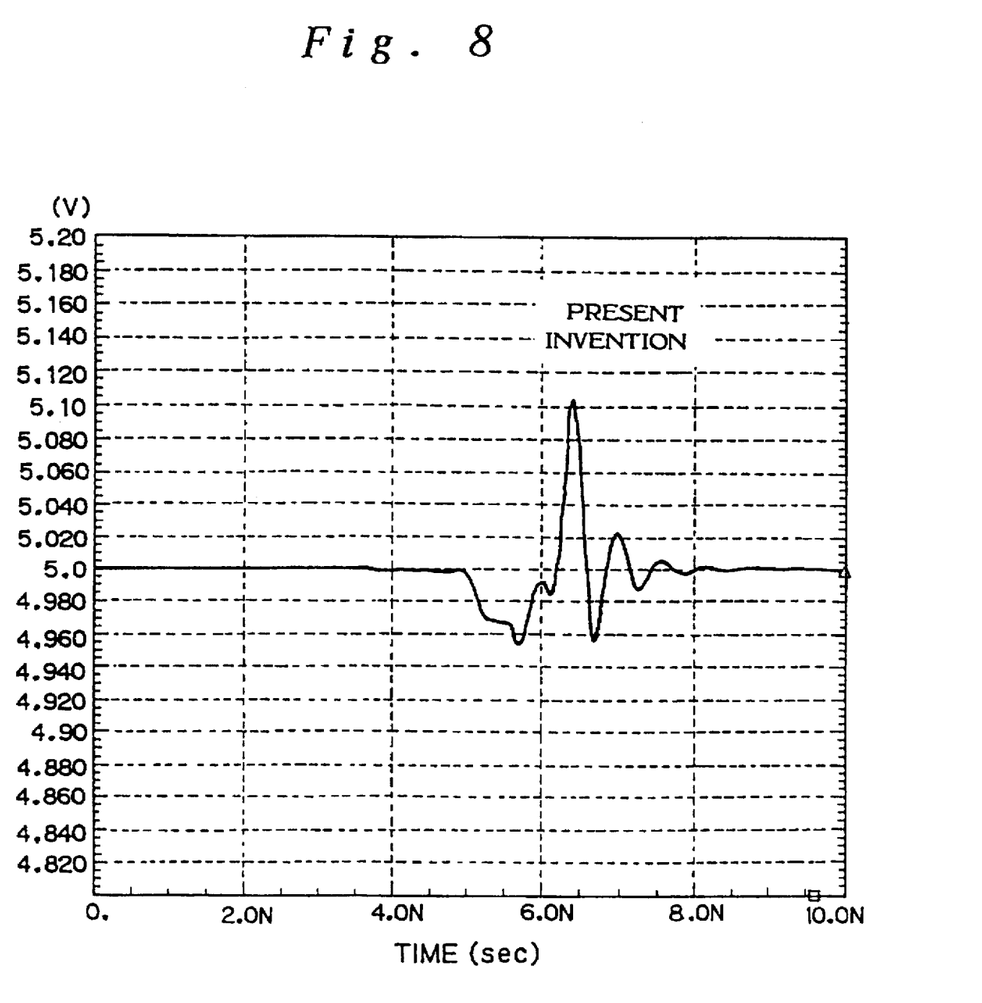
FIG. 8 is a diagram obtained by a simulation showing the fluctuation of a nominally 5-volt supply voltage for the inverter device according to the present invention due to a switching operation in the inverter device.
Figure 9:
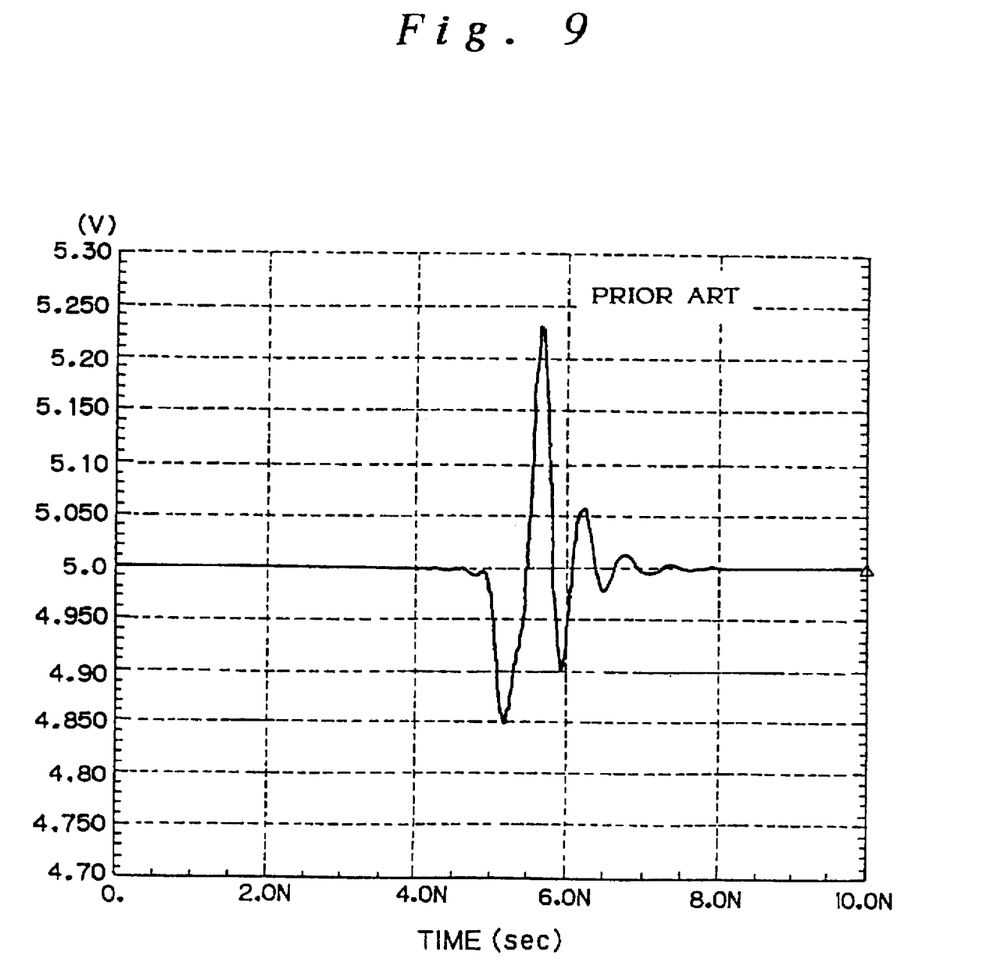
FIG. 9 is a diagram obtained by a simulation showing the fluctuation of a nominally 5-volt supply voltage for the above mentioned prior art inverter device due to a switching operation in the prior art inverter device.

Referring now to FIGS. 8 and 9, the supply voltage fluctuations will be comparatively described which occur due to a switching operation in each of the present invention's inverter device and the above prior art inverter device. FIG. 8 shows fluctuation in the nominally 5 volts supply voltage for the inverter device of the present invention, while FIG. 9 shows fluctuation in the nominally 5 volts supply voltage for the prior art device. As seen from the figures, the prior art device has the voltage fluctuation in the range from about 4.85 volts to about 5.23 volts around the nominal voltage of 5 volts, while the inverter device of the present invention has the voltage fluctuation in the range from about 4.96 volts to about 5.11 volts, indicating a significant effect for suppression of supply voltage fluctuation achieved by the present invention.

In the embodiment described above, the delay times are selected to 0.75 ns and 2.25 ns, respectively. However, they may be selected to other values. Also, the low-pass filters may be formed by selectively using any one of the possible combinations of the above mentioned wiring conductor layers.

According to the present invention as described above, an inverter device, which includes a main inverter circuit comprising a pair of transistors, operates to cause the transistors to switch with a greater time difference. This can result in a significant reduction of the noises which may be imposed on a power supply voltage for the inverter device or other circuits connected to the power supply due to the operation of the inverter device. Thus, according to the invention, an inverter device is provided which can be used with analog circuits having high accuracies.

What is claimed is:

1. An inverter device comprising:
   (a) an input terminal for receiving an input signal and an output terminal for generating an output signal;
   (b) a first inverter circuit including a first transistor of a first conductivity type and a second transistor of a second conductivity type different from the first conductivity type, said first transistor having a first current carrying electrode connected to a first supply voltage conductor, a second current carrying electrode connected to said output terminal and a control electrode, said second transistor having a first current carrying electrode connected to a second supply voltage conductor, a second current carrying electrode connected to said output terminal and a control electrode;
   (c) a first variable delay means connected between said input terminal and said control electrode of said first transistor for generating a first delayed output signal with a variable delay, said first variable delay means including a first capacitor, said first variable delay means including a first resistance operative with said first capacitor to cause said first delayed output signal to have a first delay when said input signal changes in a first direction making said first and second transistors conductive and non-conductive, respectively; and
   (d) a second variable delay means connected between said input terminal and said control electrode of said second transistor for generating a second delayed output signal with a variable delay, said second variable delay means including a second capacitor, said second variable delay means including a second resistance operative with said second capacitor to cause said second delayed output signal to have a second delay shorter than said first delay when said input signal changes in said first direction;
   said first variable delay means including a third resistance operative with said first capacitor to cause said first delayed output signal to have a third delay when said input signal changes in a second direction making said first and second transistors non-conductive and conductive, respectively,
   said second variable delay means including a fourth resistance operative with said second capacitor to cause said second delayed output signal to have a fourth delay longer than said third delay when said input signal changes in said second direction,
   to cause said second transistor to become non-conductive before said first transistor becomes conductive when said input signal changes in said first direction and to cause said first transistor to become non-conductive before said second transistor becomes conductive when said input signal changes in said second direction to minimize noise currents flowing simultaneously through both said first and second transistors into said first and second supply voltage conductors.

2. An inverter device according to claim 1, wherein:
   said first variable delay means comprises:
   a) at least one stage of second inverter circuit connected between said first supply voltage conductor and said second supply voltage conductor; and
   b) a first low-pass filter including said first capacitor and having an input connected for receiving an output of said second inverter circuit and an output connected to said control electrode of said first transistor; and wherein:
   said second variable delay means comprises:
   a) at least one stage of third inverter circuit connected between said first supply voltage conductor and said second supply voltage conductor; and
   b) a second low-pass filter including said second capacitor and having an input connected for receiving an output of said third inverter circuit and an output connected to said control electrode of said second transistor.

3. An inverter device according to claim 2, wherein each of said second and third inverter circuits comprises a single stage of inverter circuit.

4. An inverter device according to claim 3, wherein:
   said second inverter circuit comprises:
   (a) a third transistor of the first conductivity type having a first current carrying electrode connected to said first supply voltage conductor, a second current carrying electrode connected to a first common node and a control electrode connected to said input terminal, said first resistance including an on resistance of said third transistor; and
   (b) a fourth transistor of the second conductivity type having a first current carrying electrode connected to said second supply voltage conductor, a second current carrying electrode connected to said first common node and a control electrode connected to said input terminal, said third resistance including an on resistance of said fourth transistor; and wherein:
   said third inverter circuit comprises:
   (a) a fifth transistor of the first conductivity type having a first current carrying electrode connected to said first supply voltage conductor, a second current carrying electrode connected to a second common node and a control electrode connected to said input terminal, said second resistance including an on resistance of said fifth transistor; and
   (b) a sixth transistor of the second conductivity type having a first current carrying electrode connected to said second supply voltage conductor, a second current carrying electrode connected to said second common node and a control electrode connected to said input terminal, said fourth resistance including an on resistance of said sixth transistor.

5. An inverter device according to claim 4, wherein each of said transistors of the first conductivity type is a p-type metal-oxide-semiconductor (MOS) transistor, and each of said transistors of the second conductivity type is an n-type MOS transistor.

6. An inverter device according to claim 5, wherein said third transistor has a channel width greater than a channel width of said fourth transistor, and wherein said fifth transistor has a channel width smaller than a channel width of said sixth transistor.

7. An inverter device according to claim 4 wherein said first inverter circuit is connected to said first and second supply voltage conductors at nodes which are remote from respective nodes at which each of said second and third inverter circuits is connected to said first and second supply voltage conductors.

8. An inverter device according to claim 4 wherein:

said first low-pass filter comprises:
 a) a first resistor connected between said first common node and said control electrode of said first transistor; and
 b) said first capacitor connected at its one end to said control electrode of said first transistor and at the other end to one or both of said first and second supply voltage conductors; and wherein:

said second low-pass filter comprises:
 a) a second resistor connected between said second common node and said control electrode of said second transistor; and
 b) said second capacitor connected at its one end to said control electrode of said second transistor and at the other end to one or both of said first and second supply voltage conductors.

9. An inverter device according to claim 8, wherein:

said inverter device is formed on an integrated-circuit;

each of said first and second resistors comprising a wiring conductor resistance;

said first capacitor comprising a) a first metal conductor connecting said first common node to said control electrode of said first transistor, b) a substrate of said integrated-circuit, a power supply metal conductor and/ or a ground metal conductor around said first metal conductor, and c) insulation layer means formed between said first metal conductor and said substrate, said power supply metal conductor and/or said ground metal conductor; and said second capacitor comprising a) a second metal conductor connecting said second common node to said control electrode of said second transistor, b) said substrate of said integrated-circuit, said power supply metal conductor and/or said ground metal conductor around said second metal conductor, and c) insulation layer means formed between said second metal conductor and said substrate, said power supply metal conductor and/or said ground metal conductor.

10. A low noise inverter circuit comprising in combination:

(a) an input terminal for receiving an input signal and an output terminal for generating an output signal;

(b) a first inverter circuit including a first transistor of a first conductivity type and a second transistor of a second conductivity type different from the first conductivity type, said first transistor having a first current carrying electrode connected to a first supply voltage conductor, a second current carrying electrode connected to said output terminal and a control electrode, said second transistor having a first current carrying electrode connected to a second supply voltage conductor, a second current carrying electrode connected to said output terminal and a control electrode;

(c) a first variable delay circuit connected between said input terminal and said control electrode of said first transistor producing a first delayed output signal with a variable delay, said first variable delay circuit including a first capacitor, said first variable delay circuit including a first resistance operative with said first capacitor to cause said first delayed output signal to have a first delay when said input signal changes in a first direction making said first and second transistors conductive and non-conductive, respectively; and (d) a second variable delay circuit connected between said input terminal and said control electrode of said second transistor producing a second delayed output signal with a variable delay, said second variable delay circuit including a second capacitor, said second variable delay circuit including a second resistance operative with said second capacitor to cause said second delayed output signal to have a second delay shorter than said first delay when said input signal changes in said first direction;

said first variable circuit means including a third resistance operative with said first capacitor to cause said first delayed output signal to have a third delay when said input signal changes in a second direction making said first and second transistors non-conductive and conductive, respectively, said second variable delay circuit including a fourth resistance operative with said second capacitor to cause said second delayed output signal to have a fourth delay longer than said third delay when said input signal changes in said second direction, to cause said second transistor to become non-conductive before said first transistor becomes conductive when said input signal changes in said first direction and to cause said first transistor to become non-conductive before said second transistor becomes conductive when said input signal changes in said second direction to minimize noise currents flowing simultaneously through both said first and second transistors into said first and second supply voltage conductors.

* * * * *